United States Patent
Elliott et al.

(10) Patent No.: US 6,246,353 B1
(45) Date of Patent: Jun. 12, 2001

(54) INTEGRATED-CIRCUIT STRUCTURES AND METHODS FOR CORRECTION OF TEMPERATURE AND PROCESS-INDUCED PARAMETER ERRORS

(75) Inventors: Michael R. Elliott; Frank Murden, both of Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/394,632

(22) Filed: Sep. 13, 1999

(51) Int. Cl.[7] .................................................. H03M 1/12
(52) U.S. Cl. .................. 341/156; 341/155; 341/120; 341/132; 341/127; 341/118; 341/119; 341/143; 341/121; 341/159; 341/158; 341/156; 340/347; 307/360; 307/361; 307/362; 307/494
(58) Field of Search ....................................... 341/155, 120, 341/132, 127, 118, 119, 121, 143, 156, 158

(56) References Cited

U.S. PATENT DOCUMENTS

| | | | | |
|---|---|---|---|---|
| 4,158,804 | * | 6/1979 | Butler et al. | 323/22 |
| 5,313,207 | * | 5/1994 | Kouno et al. | 341/156 |
| 5,319,370 | * | 6/1994 | Signore et al. | 341/120 |
| 5,384,569 | * | 1/1995 | Komatsu | 341/159 |
| 5,440,305 | * | 8/1995 | Signore et al. | 341/120 |
| 5,497,155 | * | 3/1996 | Izuhara | 341/156 |
| 5,530,444 | * | 6/1996 | Tice et al. | 341/156 |
| 5,550,492 | | 8/1996 | Murden et al. | 327/65 |
| 5,684,419 | | 11/1997 | Murden et al. | 327/104 |

OTHER PUBLICATIONS

Kester, Walt, et al., *High Speed Design Techniques*, Analog Devices, Inc., Norwood, MA., 1996, pp. 4–36 to 4–47.

* cited by examiner

Primary Examiner—Michael Tokar
Assistant Examiner—Lam T. Mai
(74) Attorney, Agent, or Firm—Koppel & Jacobs

(57) ABSTRACT

Integrated-circuit structures and methods are provided for generating an error signal that represents temperature and process-induced signal changes in transistor parameters. In particular, a reference transistor and a sense transistor are biased to each generate a substantially temperature-insensitive minority-carrier current. The reference transistor is provided with a substantially constant voltage across its current terminals to convert its minority-carrier current into a substantially temperature-insensitive reference current $I_R$. In contrast, the sense transistor is provided with a temperature-varying voltage across its current terminals to convert its minority-carrier current into a temperature-varying sense current $I_S$. The reference current and the sense current are then differenced to realize an error signal $I_E$ that contains information that describes temperature and process-induced signal errors in integrated-circuit transistor stages. The error signal is especially useful for correcting signal errors in circuits that cannot accommodate conventional signal-stabilizing circuitry because that circuitry would degrade circuit operation.

18 Claims, 4 Drawing Sheets

US 6,246,353 B1

INTEGRATED-CIRCUIT STRUCTURES AND METHODS FOR CORRECTION OF TEMPERATURE AND PROCESS-INDUCED PARAMETER ERRORS

BACKGROUND OF THE INVENTION

1. Field of the Invention

The present invention relates generally to temperature and process-induced integrated-circuit parameter errors and more particularly, to structures and methods for correcting such errors.

2. Description of the Related Art

Because they are created by the same diffusion processes, active components of integrated circuits are inherently well matched. In an active-component example, equal values of $V_{BE}$ in different bipolar transistors generate substantially equal base and emitter currents and absolute $V_{BE}$ values substantially track over temperature. Similarly, passive-component values (e.g., resistances) substantially track over temperature.

Absolute parameter values, however, vary over temperature within one integrated circuit and vary from lot-to-lot because of process-induced changes. Various conventional integrated-circuit design techniques (e.g., current mirroring and feedback) can generally correct the signal errors that would otherwise result from these changes. For example, feedback is typically used to cause amplifier gains to be defined as resistor ratios because such ratios substantially cancel temperature and process-induced changes.

Nonetheless, there are change-induced signal errors whose correction is not amenable to conventional integrated-circuit design techniques. An exemplary case is found in the pipelined stages of a subranging analog-to-digital converter (ADC).

In these converters, an initial ADC stage responds to the output of an initial sampler by quantizing the analog input signal to an initial number of digital bits. A digital-to-analog converter (DAC) responds to the initial ADC stage and its analog output is subtracted from the sampler's output to obtain an analog residue signal which is then pipelined to a subsequent ADC stage that quantizes it to a subsequent number of digital bits.

To enhance operation of the subsequent ADC stage, the residue signal is typically "gained up" by a precision amplifier and then sampled by a subsequent sampler. Subranging ADC degradation (e.g., nonlinearities, missing codes) will be observed if the processed residue signal does not match the input range of the subsequent stage.

Closed-loop feedback techniques are typically used to substantially eliminate gain errors in the precision amplifier but, principally because of speed considerations, these techniques are generally not available to the subsequent sampler. Accordingly, it forms a source of unresolved pipeline gain error which can cause subranging ADC degradation.

SUMMARY OF THE INVENTION

The present invention is directed to integrated-circuit structures and methods for correcting temperature and process-induced parameter errors. This goal is achieved with a method of generating an error signal that represents temperature and process-induced changes in integrated-circuit transistor output impedance.

In a method embodiment of the invention, a reference transistor and a sense transistor are biased to each generate a substantially temperature-insensitive minority-carrier current. The reference transistor is provided with a substantially constant voltage across its current terminals to convert its minority-carrier current into a substantially temperature-insensitive reference current $I_R$.

In contrast, the sense transistor is provided with a temperature-varying voltage across its current terminals to convert its minority-carrier current into a temperature-varying sense current $I_S$. The reference current and the sense current are then differenced to realize an error signal $I_E$. Preferably, the voltage across the sense transistor's current terminals is varied substantially linearly with temperature.

Because the reference transistor and the sense transistor are formed in the same integrated-circuit production lot, the reference transistor's current $I_R$ subtracts out the absolute collector component of the sense transistor's current $I_S$ so that the error signal $I_E$ represents only those changes generated over temperature due to the process-dependent Early voltage $V_A$.

Many integrated-circuit systems (e.g., subranging analog-to-digital converters) contain circuits that generate temperature and process-induced signal errors but that cannot accommodate conventional signal-stabilizing circuitry because that circuitry would degrade circuit operation. The error signal $I_E$ is especially useful for correcting these signal errors because it contains information that describes temperature and process-induced signal changes in transistor parameters.

The teachings of the invention may be practiced with various transistor types (e.g., bipolar and complementary metal-oxide semiconductor (CMOS) transistors) in which current terminals respond to a control terminal. For bipolar transistors, the voltage across the transistor's current terminals is typically referred to as the collector-emitter voltage $V_{CE}$.

The novel features of the invention are set forth with particularity in the appended claims. The invention will be best understood from the following description when read in conjunction with the accompanying drawings.

DETAILED DESCRIPTION OF THE PREFERRED EMBODIMENTS

Figure 1:
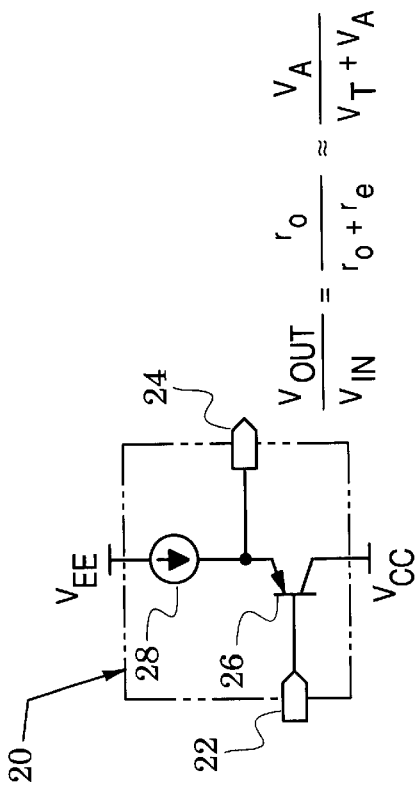
FIG. 1 is a diagram of a common-collector transistor stage.

Integrated-circuit signal errors often have a source in the imperfections of the transfer functions of bipolar transistors. An exemplary signal-error generation is illustrated in FIG. 1 which shows a common-collector transistor stage 20 in which a signal input port 22 and a signal output port 24 are respectively coupled to the base and emitter of a transistor 26. The transistor's emitter is provided with an active load in the form of a current source 28 and the stage 20 is coupled between voltage supplies $V_{EE}$ and $V_{CC}$.

Various semiconductor references (e.g., see Gray, Paul R., et al., *Analysis and Design of Analog Integrated Circuits*, John Wiley & Sons, New York, third edition, 1993, pp. 205–207) develop an emitter-controlled T-model that characterizes transistor operation. From this model, it is apparent that the transistor stage 20 has a transfer function of $$\frac{V_{out}}{V_{in}} \approx \frac{r_o}{r_o + r_e} \qquad (1)$$

in which $r_o$ and $r_e$ are respectively the small-signal transistor parameters of emitter resistance and output resistance.

If the output resistance $r_o$ were infinite, the transfer function (1) would reduce to unity. If the output resistance $r_o$ were fixed and the emitter resistance $r_e$ temperature-insensitive, the transfer function (1) would not introduce temperature-sensitive error. Unfortunately, the output resistance $r_o$ is finite and both $r_o$ and $r_e$ are temperature and process-dependent.

Figure 2:
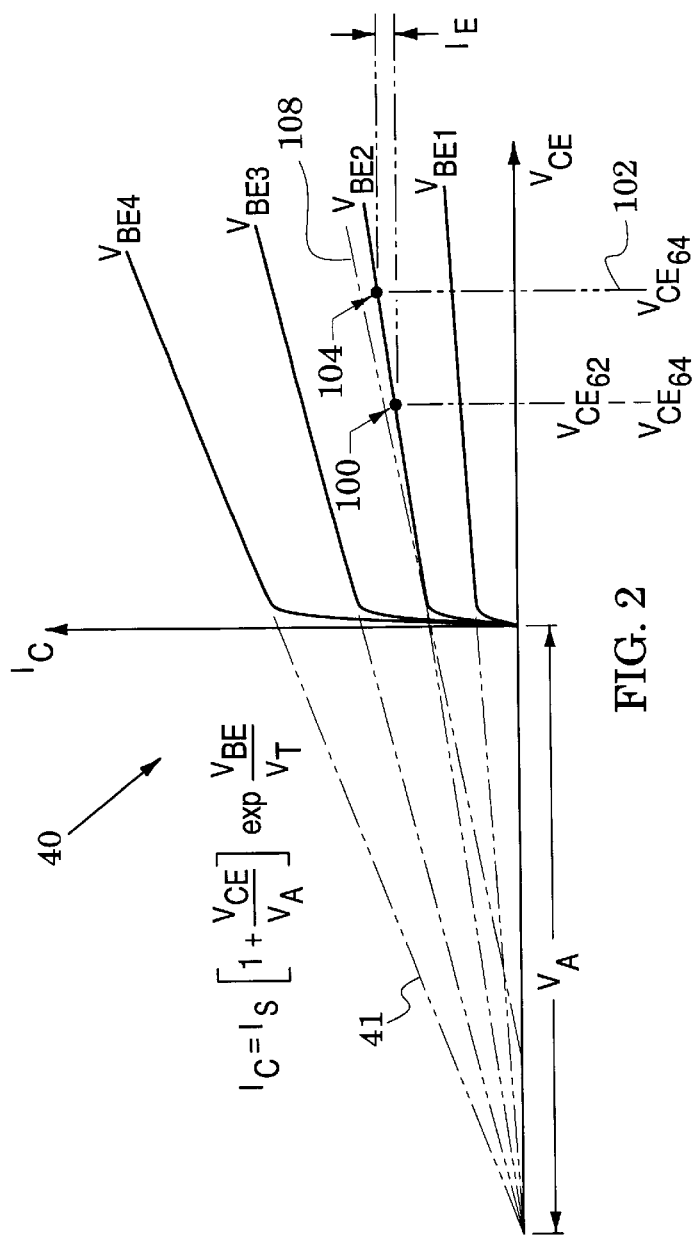
FIG. 2 is a graph of typical output characteristics for the transistor of FIG. 1.

The graph 40 of FIG. 2 plots collector current $I_C$ of the transistor 26 of FIG. 1 as a function of collector-emitter voltage $V_{CE}$ and of different base-emitter voltages $V_{BE}$. It is apparent that collector current is not constant but, rather, increases with increased collector-emitter voltage $V_{CE}$. When the collector characteristics are extrapolated back to the $V_{CE}$ axis (as with the broken lines 41), they intercept it at the well-known Early voltage $V_A$. As indicated in FIG. 2, the collector current is accordingly given by $$I_C = I_S\left(1 + \frac{V_{CE}}{V_A}\right)\exp\frac{V_{BE}}{V_T} \qquad (2)$$

in which the saturation current $I_S$ is a constant (e.g., see Gray, p. 19).

It can be seen from equation (2) that collector current would be essentially constant if $V_A >> V_{CE}$. Because $V_A$ and $V_{CE}$ are substantially of the same order, however, the collector current characteristics of FIG. 2 are not flat but have a slope which is the transistor's output resistance $r_o$ and that resistance can be expressed as $r_o = V_A/I_C$ (e.g., see Gray, p. 35). In addition, the transistor's emitter-base junction can be regarded as having the same dynamic resistance as that of a forward-biased diode so that the emitter resistance is given by $r_e = V_T/I_C$ in which $V_T$ is the thermal voltage (e.g., see Bogart, Theodore, *Electronic Devices and Circuits*, MacMillan Publishing Company, New York, 1993, pp. 163–164).

When these expressions are substituted, equation (1) becomes $$\frac{V_{out}}{V_{in}} \approx \frac{r_o}{r_o + r_e} = \frac{V_A}{V_T + V_A} \qquad (3)$$

in which the thermal voltage $V_T$ varies directly with temperature and the Early voltage $V_A$ is process dependent. For example, $V_A$ typically varies over a range on the order of 10–40 volts in PNP transistors and over a range on the order of 80–140 volts in NPN transistors. Equation (3) thus shows that the transistor stage 20 of FIG. 1 will introduce temperature and process-induced gain errors into those integrated circuits that cannot accommodate additional gain-stabilizing circuitry because that circuitry would degrade circuit operation.

Figure 3:
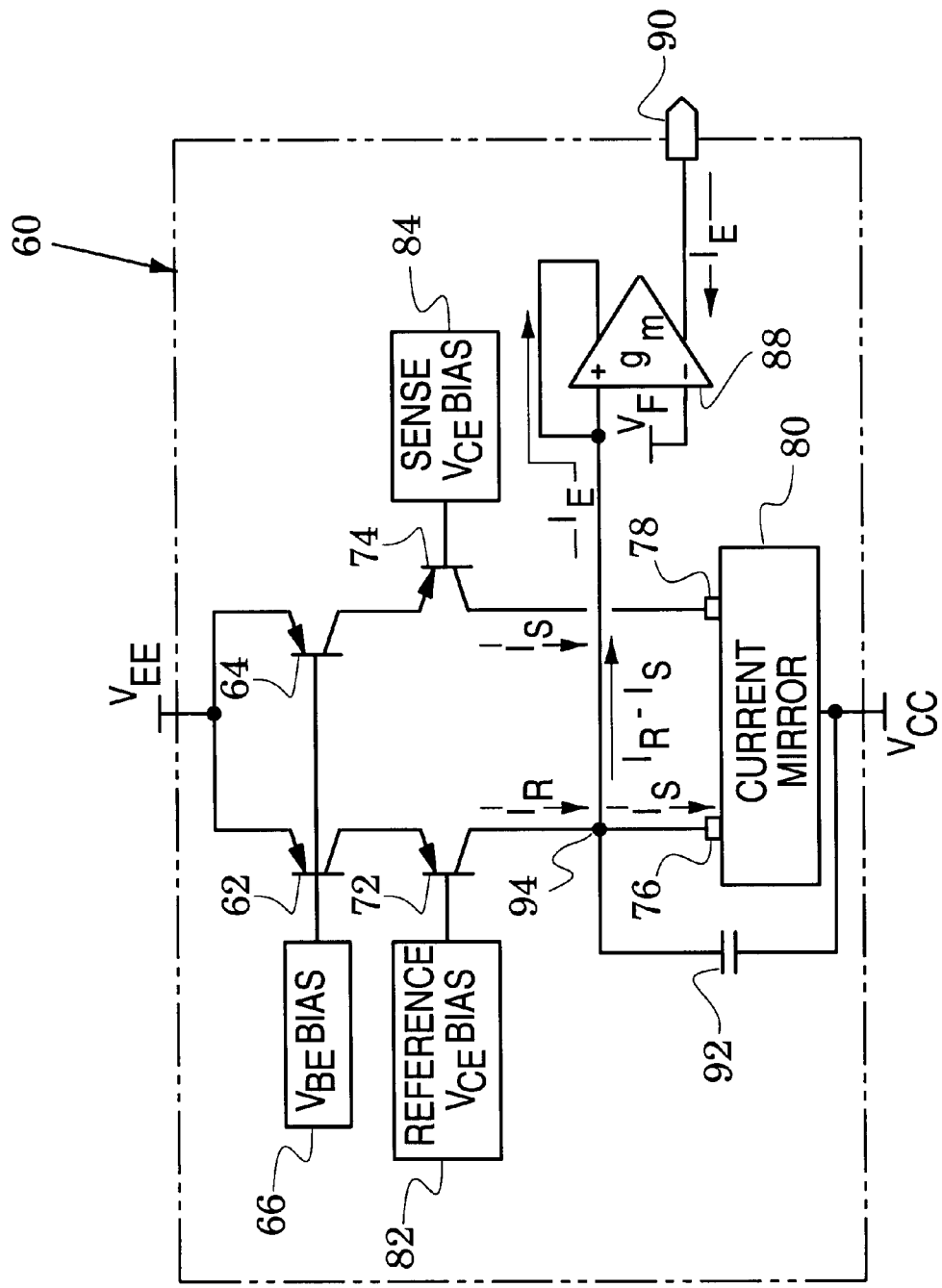
FIG. 3 is a correction circuit of the present invention for generating an error signal that characterizes temperature and process-induced parameter changes.

The correction circuit 60 of FIG. 3 has been found effective in correcting these temperature and process-induced gain errors without intruding into circuit performance. The circuit 60 includes a reference transistor 62 arranged in parallel with a sense transistor 64 with their bases coupled to a $V_{BE}$ bias source 66.

Transistors 72 and 74 are respectively connected in cascode arrangements with the reference and sense transistors 62 and 64 and they also respectively couple these transistors to first and second ports 76 and 78 of a current mirror 80. The base of the reference cascode transistor 72 is coupled to a reference $V_{CE}$ bias source 82 and the base of the the sense cascode transistor 74 is coupled to a sense $V_{CE}$ bias source 84.

The first port 76 of the current mirror 80 is connected to a first input port of a differential amplifier 88 and one of the output ports of the differential amplifier forms the output port 90 of the correction circuit 60. An output port of the differential amplifier is directly fed back to the first input port, a stability capacitor 92 is coupled across this same port and the other input port has a fixed bias $V_F$.

In operation of the correction circuit 60, the $V_{BE}$ bias source 66 is configured to maintain substantially temperature-insensitive collector currents in the reference and sense transistors 62 and 64 if these transistors had infinite Early voltages. That is, the $V_{BE}$ bias source 66 is configured to generate substantially temperature-insensitive minority-carrier currents that can then be converted into collector currents by the collector-emitter bias of each transistor.

Figure 4:
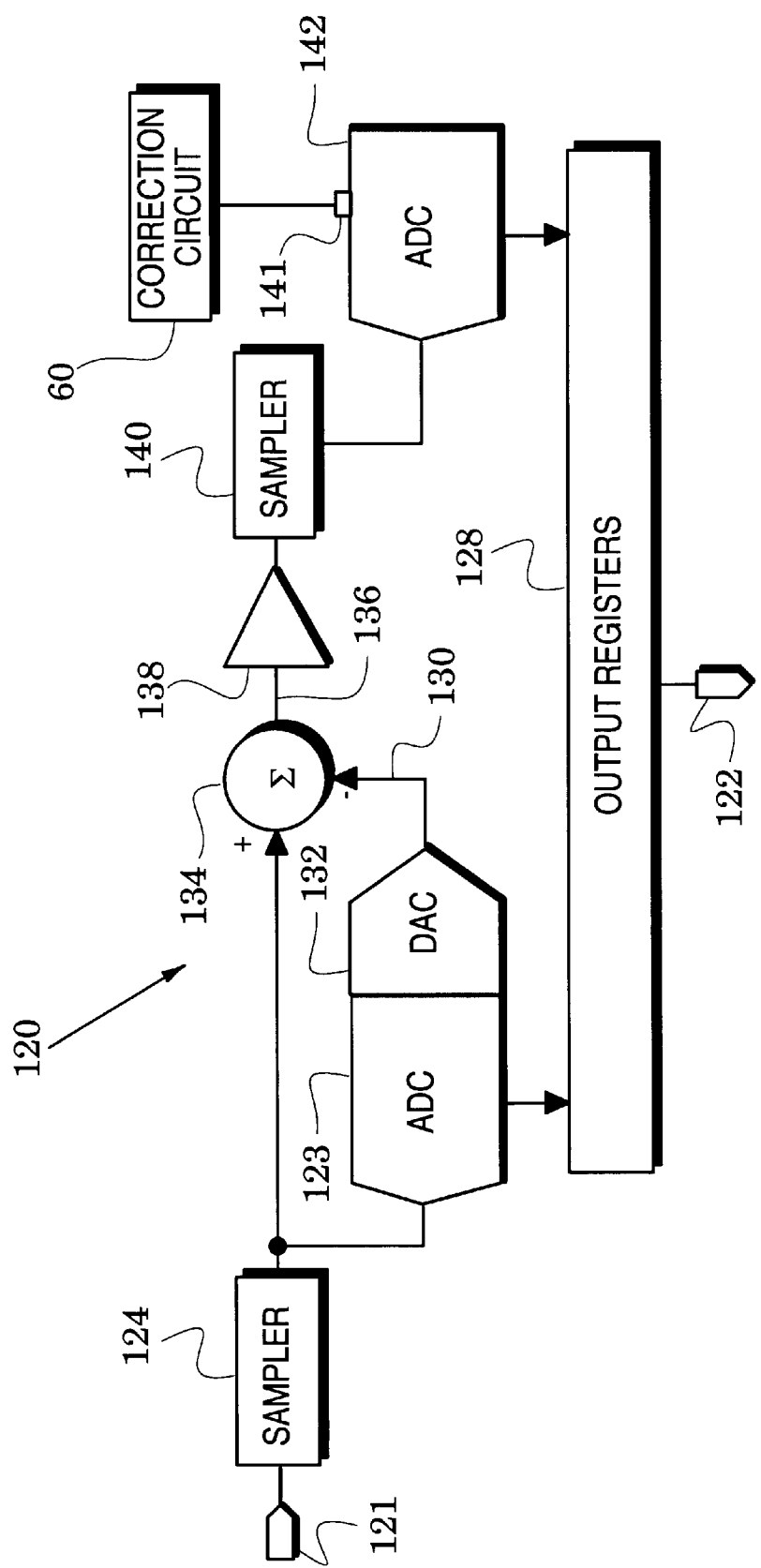
FIG. 4 is a block diagram of a subranging ADC that incorporates the correction circuit of FIG. 3.

The saturation current $I_S$ is the dominant contributor to temperature sensitivity in equation (2) but its effects can be substantially eliminated by selecting the $V_{BE}$ bias source 66 from various conventional bias circuits (e.g., a current mirror as in FIG. 4.1 of Gray that is biased with a current-source reference).

The reference $V_{CE}$ bias source 82 is configured to maintain a substantially temperature-insensitive collector-emitter bias $V_{CE}$ across the reference transistor 62. Because this bias source must therefore cancel the temperature-induced voltage changes across the base-emitter junction of the cascode-coupled transistor 72, it can be selected from various conventional $V_{BE}$-referenced bias circuits.

In contrast to the reference $V_{CE}$ bias source 82, the sense $V_{CE}$ bias source 84 is configured to supply a collector-emitter bias $V_{CE}$ across the sense transistor 64 that varies substantially linearly with temperature. Thus, the sense $V_{CE}$ bias source 84 can be selected from various conventional circuits that generate a bias voltage that varies linearly with temperature.

Because their bases are biased by the $V_{BE}$ bias source 66, the reference transistor 62 and the sense transistor each generate a substantially temperature-insensitive minority-carrier current. The reference transistor receives a substantially-constant collector-emitter bias $V_{CE}$ that converts its minority-carrier current into a substantially temperature-insensitive reference current $I_R$ that flows towards the first port 76 of the current mirror 80.

In contrast, the sense transistor receives a temperature-varying collector-emitter bias $V_{CE}$ that converts its minority-carrier current into a temperature-varying sense current $I_S$ that flows towards the second port 78 of the current mirror 80. In response to the sense current at its second port, the current mirror 80 mirrors a substantially-equal current $I_S$ at its first port 76. An application of Kirchoff's current law at a circuit node 94 of FIG. 3 indicates that an error current $I_E = I_R - I_S$ must flow to an input of the differential amplifier 88.

The error current is therefore an error signal formed by differencing the reference and sense currents. Because of its high input impedance and its direct feedback configuration, the differential amplifier 88 acts as a transconductance ($g_m$) amplifier so that it drives an error current into both of its output ports and thus draws an error current $I_E$ from the output port 90 of the correction circuit 60.

As an aid in analyzing the error current $I_E$, the graph 40 of FIG. 2 can be considered to illustrate the output characteristic of both the reference transistor 62 and the sense transistor 72 of FIG. 3. If it is assumed that a base bias of $V_{BE2}$ is initally generated by the $V_{BE}$ bias source 66 of FIG. 3 and that a fixed collector-emitter bias $V_{CE62}$ is maintained across the reference transistor 62, then the output of the reference transistor 62 operates at an operating point 100. Because of the $V_{BE}$ bias source 66 of FIG. 3, it can also be assumed that the plot $V_{BE2}$ of FIG. 3 remains fixed over temperature.

In FIG. 3, it is next assumed that the sense $V_{CE}$ bias source 82 generates a collector-emitter bias $V_{CE64}$ for the sense transistor 64 that equals $V_{CE62}$ at a first temperature so that the sense transistor also initially operates at the operating point 100. At a second temperature, however, the sense $V_{CE}$ bias source 82 generates a collector-emitter bias $V_{CE64}$ that moves to a second position 102. At the second position, the sense transistor 64 operates at an operating point 104. The reference current $I_R$ and the sense current $I_S$ of FIG. 3 now differ by the error current $I_E$ that is indicated in FIG. 2.

The Early voltage $V_A$ will differ over different integrated-circuit fabrication lots. In an exemplary lot, for example, $V_A$ may be less so that the characteristic plots of FIG. 2 will have steeper slopes. This is indicated by a smaller $V_A$ and a steeper slope that are associated with the broken line 108 in FIG. 2. In this exemplary production lot, a greater error current $I_E$ would be generated by the correction circuit 60 of FIG. 3.

Because the reference transistor 62 and the sense transistor 64 always belong to the same production lot, it is apparent that the reference transistor's current $I_R$ subtracts out the absolute collector currents in FIG. 2 so that the error current $I_E$ represents only those changes generated over temperature due to the process-dependent paramater $V_A$. Thus, the error current $I_E$ contains information that describes the temperature and process-induced signal errors generated in the exemplary transistor stage 20 of FIG. 1. This information can be used to correct signal errors in a variety of integrated-circuit systems.

An exemplary system is the subranging ADC 120 of FIG. 4 which converts analog signals at an input port 121 to digital signals at an output port 122. It includes an initial ADC stage 123 that responds to the output of an initial sampler 124 which receives an input analog signal from the input port 121. The analog signal of the initial ADC stage is communicated to output registers 128 and is also converted to an analog signal 130 by a digital-to-analog converter 132.

The resulting analog signal is subtracted in a subtractor 134 from the output of the initial sampler 124 to generate an analog residue signal 136 which is pipelined via a precision amplifier 138 and a subsequent sampler 140 to a subsequent ADC stage 142. The correction circuit 60 of FIG. 3 has its output coupled to a range-adjustment port 141 of the subsequent ADC stage 142 and the output of the subsequent ADC stage is combined with that of the initial ADC stage in the output registers 128 to form a digital output at the ADC output port 122.

In operation of the subranging ADC 120, the input analog signal is initially quantized to an initial set of digital bits which are communicated to the output registers 128. The analog residue signal 136 is subsequently quantized to a subsequent set of digital bits which are also communicated to the output registers 128.

Because the residue signal 136 represents quantization errors in the intitial stage, its amplitude is accordingly reduced from that of the signals at the input port 121. In order to enhance the resolution of the subsequent ADC stage 142, the residue signal 136 is therefore "gained up" by the precision amplifier 138 prior to being sampled in the sampler 140. The amplitude of the residue signal is thus altered by the gains of the precision amplifier 138 and the sampler 140.

Feedback techniques are used to substantially eliminate temperature and process-induced gain errors in the precision amplifier 138 but those techniques would unacceptably alter the high-speed performance of the sampler 140. Because of gain errors in the subsequent sampler 140, the range of the residue signal may fail to match the range of the subsequent ADC stage with consequent generation of ADC errors (e.g., nonlinearities and missing codes).

The range of the subsequent ADC stage 142 is responsive to an error signal applied at its range-adjustment port 141. Because the error current $I_E$ contains information that describes temperature and process-induced signal errors, its application to the subsequent ADC stage adjusts the analog input range of this stage to substantially correct the gain errors of the subsequent sampler 140.

Figure 5A:
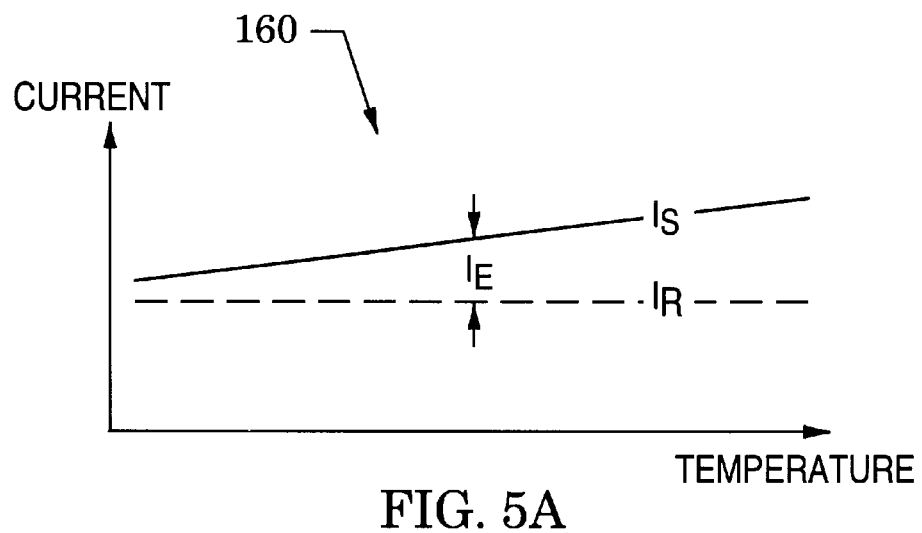
FIGS. 5A–5C are graphs that illustrate gain-error correction in the ADC of FIG. 4 with the correction circuit of FIG. 3.
Figure 5B:
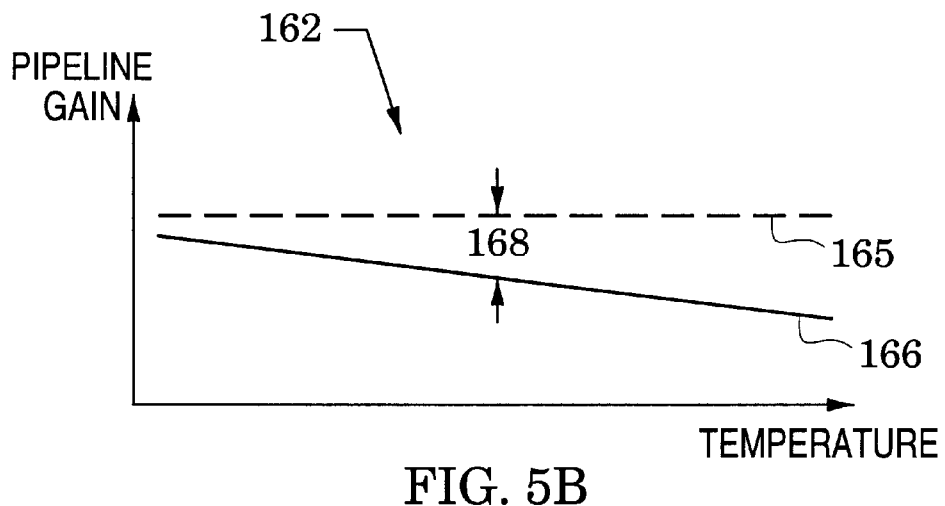
Figure 5C:
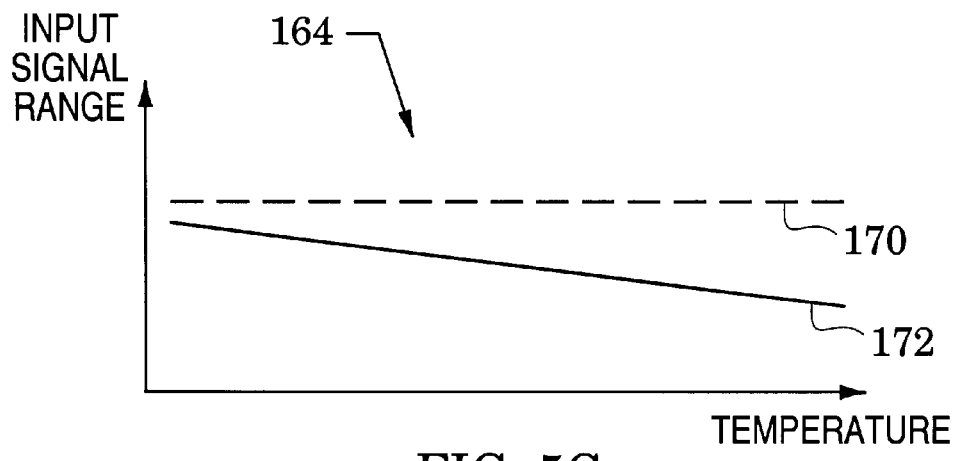

Operation of the subranging ADC 120 is summarized in the graphs 160, 162 and 164 of FIGS. 5A–5C. The graph 160 shows that the correction circuit 60 generates a substantially temperature-insensitive reference current $I_R$ and generates a sense current $I_S$ that varies over temperature due to the process-dependent parameter $V_A$. The correction circuit 60 differences these signals to provide an error current $I_E$ that only contains the temperature and process-induced variation.

The graph 162 indicates pipeline gain, i.e., the combined gain of the precision amplifier 138 and sampler 140 of FIG. 4. The broken line 165 indicates a desired constant gain over temperature and the solid line 166 indicates a typical gain that reduces over temperature because of temperature and process-induced errors. The difference between these gains is a gain error 168 that is substantially given by $V_A/(V_A+V_T)$.

Graph 164 shows the input analog signal range of the subsequent ADC stage 142 of FIG. 4. In the absence of the correction circuit 60 of FIG. 3, this input range would be the substantially-constant input range 170. Because, the pipeline gain 166 of FIG. 5B is declining over temperature, the input range 170 of the residue signal fails to match the range of the residue signal, i.e., the input range fails to compensate for the gain error 168 of FIG. 5B.

Graph 164 also shows that the input analog range of the subsequent ADC stage will have a decreasing characteristic 172 when the error current of graph 160 is applied to the subsequent ADC stage's range-adjustment port (141 in FIG. 4). The input range is substantially corrected by the error current $I_E$ so as to substantially cancel the pipeline gain error 168.

Embodiments of the invention have been described with reference to bipolar transistors and to collector-emitter voltages. Because the output characteristics of other transistor types (e.g., CMOS transistors) also typically contain temperature and process-induced error terms, the teachings of the invention may be practiced with various transistor types in which current terminals respond to a control terminal. In general, therefore, the collector-emitter voltage can be referred to as a voltage across the transistor's current terminals.

Although the subranging ADC 120 has been shown to have a single subsequent ADC stage 142, subranging ADCs of the invention can have multiple subsequent ADC stages with each being preceded by a corresponding pair of a precision amplifier and a sampler.

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. An integrated circuit which generates an error signal that represents temperature and process-induced changes in transistor output impedance, comprising:
   a reference transistor that is biased to generate a substantially temperature-insensitive minority-carrier current and receives a substantially constant voltage across its current terminals that converts said minority-carrier current into a substantially temperature-insensitive reference current;
   a sense transistor that is biased to generate a substantially temperature-insensitive minority-carrier current and receives a temperature-varying voltage across its current terminals that converts said minority-carrier current into a temperature-varying sense current; and
   a current-differencing circuit that generates an error signal substantially equal to the difference between said sense current and said reference current;
   said error signal thus representing temperature and process-induced changes in transistor output impedance.

2. The integrated circuit of claim 1, wherein the collector-emitter voltage VCE of said sense transistor varies substantially linearly with temperature.

3. The integrated circuit of claim 1, wherein said current-differencing circuit includes a current mirror having first and second ports wherein said first port receives one of said reference current and said sense current and mirrors that current to said second port which receives the other of said reference current and said sense current to thereby generate said error signal at said second port.

4. The integrated circuit of claim 1, further including an amplifier that communicates said error signal away from said integrated circuit.

5. The integrated circuit of claim 4, wherein said amplifier is a differential amplifier.

6. The integrated circuit of claim 1, further including first and second cascode transistors that respectively couple said reference transistor and said sense transistor to said current-differencing circuit.

7. The integrated circuit of claim 1, wherein said reference and sense transistors are bipolar transistors.

8. A method of generating an error signal that represents temperature and process-induced changes in integrated-circuit transistor output impedance, comprising:
   biasing a reference transistor and a sense transistor to each generate a substantially temperature-insensitive minority-carrier current;
   providing said reference transistor with a substantially constant voltage across its current terminals to convert its minority-carrier current into a substantially temperature-insensitive reference current;
   providing said sense transistor with a temperature-varying voltage across its current terminals to convert its minority-carrier current into a temperature-varying sense current; and
   differencing said reference current and said sense current to realize said error signal.

9. The method of claim 8, wherein said sense-transistor providing step includes the step of causing said temperature-varying voltage to vary substantially linearly with temperature.

10. A subranging analog-to-digital converter system that converts an analog signal to a digital signal, comprising:
   an subranging analog-to-digital converter that includes at least initial and subsequent converter stages and a subsequent sampler that precedes said subsequent stage wherein said subsequent stage has an analog input range and said subsequent sampler has a temperature and process-sensitive gain; and
   an error-signal generation circuit that includes:
      a) a reference transistor that is biased to generate a substantially temperature-insensitive minority-carrier current and receives a substantially constant voltage across its current terminals that converts said minority-carrier current into a substantially temperature-insensitive reference current;
      b) a sense transistor that is biased to generate a substantially temperature-insensitive minority-carrier current and receives a temperature-varying voltage across its current terminals that converts said minority-carrier current into a temperature-varying sense current; and
      c) a current-differencing circuit that generates an error signal that substantially equals the difference between said reference current and said sense current;
   wherein said analog input range is responsive to said error signal to reduce conversion errors due to said temperature and process-sensitive gain.

11. The subranging analog-to-digital converter of claim 10, wherein the current terminal voltage of said sense transistor varies substantially linearly with temperature.

12. The subranging analog-to-digital converter of claim 10, wherein said current-differencing circuit includes a current mirror having first and second ports wherein said first port receives one of said reference current and said sense current and mirrors that current to said second port which receives the other of said reference current and said sense current to thereby generate said error signal at said second port.

13. The subranging analog-to-digital converter of claim 10, further including a differential amplifier that couples said error signal to said subsequent stage.

14. The subranging analog-to-digital converter of claim 10, further including first and second cascode transistors that respectively couple said reference transistor and said sense transistor to said current-differencing circuit.

15. The subranging analog-to-digital converter of claim 10, wherein said subranging analog-to-digital converter includes:
   an initial sampler responsive to said analog signal wherein said initial stage is responsive to said initial sampler and forms an initial digital signal;
   an analog-to-digital converter that converts said initial digital signal to an initial analog signal;
   a subtractor that subtracts said initial analog signal from said analog signal to form a residue signal;
   an amplifier that amplifies said residue signal into an amplified residue signal wherein said subsequent sampler is responsive to said amplified residue signal and said subsequent stage is responsive to said sampler; and
   an output register responsive to said initial and subsequent digital signals for forming said digital signal.

16. A method of converting an analog signal to a digital signal, comprising the steps of:
   converting said analog signal to said digital signal with a subranging analog-to-digital converter that has at least initial and subsequent converter stages and a sampler that precedes said subsequent stage wherein said subsequent stage has an analog input range and said sampler has a temperature and process-sensitive gain;

biasing a reference transistor and a sense transistor to each generate a substantially temperature-insensitive minority-carrier current;

providing said reference transistor with a substantially constant voltage across its current terminals to convert its minority-carrier current into a substantially temperature-insensitive reference current;

providing said sense transistor with a temperature-varying voltage across its current terminals to convert its minority-carrier current into a temperature-varying sense current;

differencing said reference current and said sense current to realize an error signal; and correcting said analog input range with said error signal to reduce conversion errors due to said temperature and process-sensitive gain.

17. The method of claim 16, wherein said sense-transistor providing step includes the step of causing said current terminal voltage to vary substantially linearly with temperature.

18. The method of claim 16, wherein said converting step includes the steps of:

sampling said analog signal to form an initial sampled signal;

converting said initial sampled signal to an initial digital signal with said initial stage;

converting said initial digital signal to an initial analog signal;

subtracting said initial analog signal from said analog signal to form a residue signal;

amplifying said residue signal into an amplified residue signal;

sampling said amplified residue signal with said sampler to form a subsequent sampled signal;

converting said subsequent sampled signal to a subsequent digital signal with said subsequent stage; and forming said digital signal from said initial and subsequent digital signals.

* * * * *